United States Patent [19]

Inrig et al.

[11] 4,150,428
[45] Apr. 17, 1979

[54] METHOD FOR PROVIDING A SUBSTITUTE MEMORY IN A DATA PROCESSING SYSTEM

[75] Inventors: Scott A. Inrig, Ottawa; Alan S. J. Chapman, Kanata both of Canada

[73] Assignee: Northern Electric Company Limited, Montreal, Canada

[21] Appl. No.: 524,538

[22] Filed: Nov. 18, 1974

[51] Int. Cl.² .................. G06F 13/00; G06F 11/00
[52] U.S. Cl. .......................... 364/200; 235/303.3
[58] Field of Search .............. 340/172.5; 445/1; 364/200 MS File, 900 MS File, 200, 900; 235/303.3, 303.4

[56] References Cited

U.S. PATENT DOCUMENTS

| | | | |
|---|---|---|---|
| 3,350,690 | 10/1967 | Rice | 340/172.5 |
| 3,434,116 | 3/1969 | Anacker | 340/172.5 |
| 3,510,844 | 5/1970 | Aranyi et al. | 364/200 |
| 3,553,654 | 1/1971 | Crane | 340/172.5 |
| 3,582,902 | 6/1971 | Hirtle et al. | 340/172.5 |
| 3,633,175 | 1/1972 | Harper | 340/172.5 |
| 3,665,418 | 5/1972 | Bouricius et al. | 364/200 |
| 3,761,879 | 9/1973 | Brandsma et al. | 364/200 |
| 3,768,074 | 10/1973 | Sharp et al. | 340/172.5 |
| 3,771,143 | 11/1973 | Taylor | 340/172.5 |
| 3,772,652 | 11/1973 | Hilberg | 340/172.5 |
| 3,810,121 | 5/1974 | Chang et al. | 340/172.5 |
| 3,882,455 | 5/1975 | Heck et al. | 364/200 |
| 3,882,470 | 5/1975 | Hunter et al. | 364/900 |
| 3,983,537 | 9/1976 | Parsons et al. | 364/200 |
| 4,015,246 | 3/1977 | Hopkins et al. | 364/200 |
| 4,028,675 | 6/1977 | Frankenberg | 364/900 |
| 4,028,678 | 6/1977 | Moran et al. | 364/900 |
| 4,028,679 | 6/1977 | Divine et al. | 364/900 |
| 4,028,683 | 6/1977 | Divine et al. | 364/900 |

*Primary Examiner*—Mark E. Nusbaum
*Assistant Examiner*—Jan E. Rhoads
*Attorney, Agent, or Firm*—Achmed N. Sadik

[57] ABSTRACT

A method for substituting one memory module for another, faulty, memory module comprises designating and marking a memory module as the substitute module, which, upon detection of a fault in the other memory module, is inhibited from responding to its own address when called, and responds to the address of the faulty module whenever the latter is called.

2 Claims, 2 Drawing Figures

METHOD FOR PROVIDING A SUBSTITUTE MEMORY IN A DATA PROCESSING SYSTEM

FIELD OF THE INVENTION

The present invention relates to data processing systems in general and in particular to the utilization of memory modules therein.

BACKGROUND OF THE INVENTION

In recent years the trend in the telephone apparatus and systems has been toward increased computerization. As a result many such systems of modern design contain data processing sub-systems to perform supervision and control functions in lieu of the hitherto extensively used electromechanical devices.

The requirements placed on telephone systems are in certain aspects sometimes in conflict with the performance specifications of conventional data processing systems. Certainly the most prominent example of such conflict arises due to the extreme reliability requirements placed on telephone systems and apparatus. In contrast, occasional failure of a computer, be it because of hard or software malfunction, is not uncommon.

While often higher reliability on telephone systems is attained by duplicating critical units of the system, such approach is in conflict with yet another import requirement, that of cost.

The present invention discloses a method for inexpensively providing spare memory capability in a data processing system at the cost of slightly reducing its normal functional capability. The present invention is particularly suitable for use in certain types of telephone systems. It is, however, not restricted to such use, as will be apparent to those skilled in related arts.

SUMMARY OF THE INVENTION

The method of the present invention is applicable in a data processing system having a plurality of separately callable memory modules each having a unique address. The method permits substitution of one memory module for another and comprises the steps of: electronically designating one memory module as a spare or substitute module; storing into an address register the address of another memory module upon fault detection in the latter inhibiting the substitute memory module from responding to its address; continuously comparing addresses of called memory modules with the address stored in the address register; and, upon occurrence of a match between the address in the register and one of said addresses of called memory modules, selecting the substitute memory module instead of said another memory module.

Usually the memory module designated as a substitute module would be one of low priority and/or low utilization probabilty (for example due to it having a high address in a read/write or scratch-pad memory) compared with the remaining modules. The substitute memory module is loaded with data substantially identical to that of the faculty module after the fault has been detected. In a preferred embodiment, this is accomplished by reading the appropriate portion of an auxiliary standby storage tape containing the data vital to the system. This, of course, occurs under the control of the CPU (Central Processing Unit) in the system in a well known manner. A useful reference in this regard is a textbook by Hans W. Gschwind titled "Design of Digital Computers, An Introduction", published in 1967 by Springer-Verlag, New York, Inc. Clearly, all other control functions such as fault location among memory modules, the calling of memory module addresses and the loading of the address of the faculty memory module into the address register are initiated by the CPU.

Any interruption of service due to the process of loading the substitute module will depend on the type and capacity of the module and should be in the order of minutes which is still better than total failure.

BRIEF DESCRIPTION OF THE DRAWINGS

An example embodiment will now be described in conjunction with the drawings in which.

DESCRIPTION OF THE PREFERRED EMBODIMENT

Figure 1:
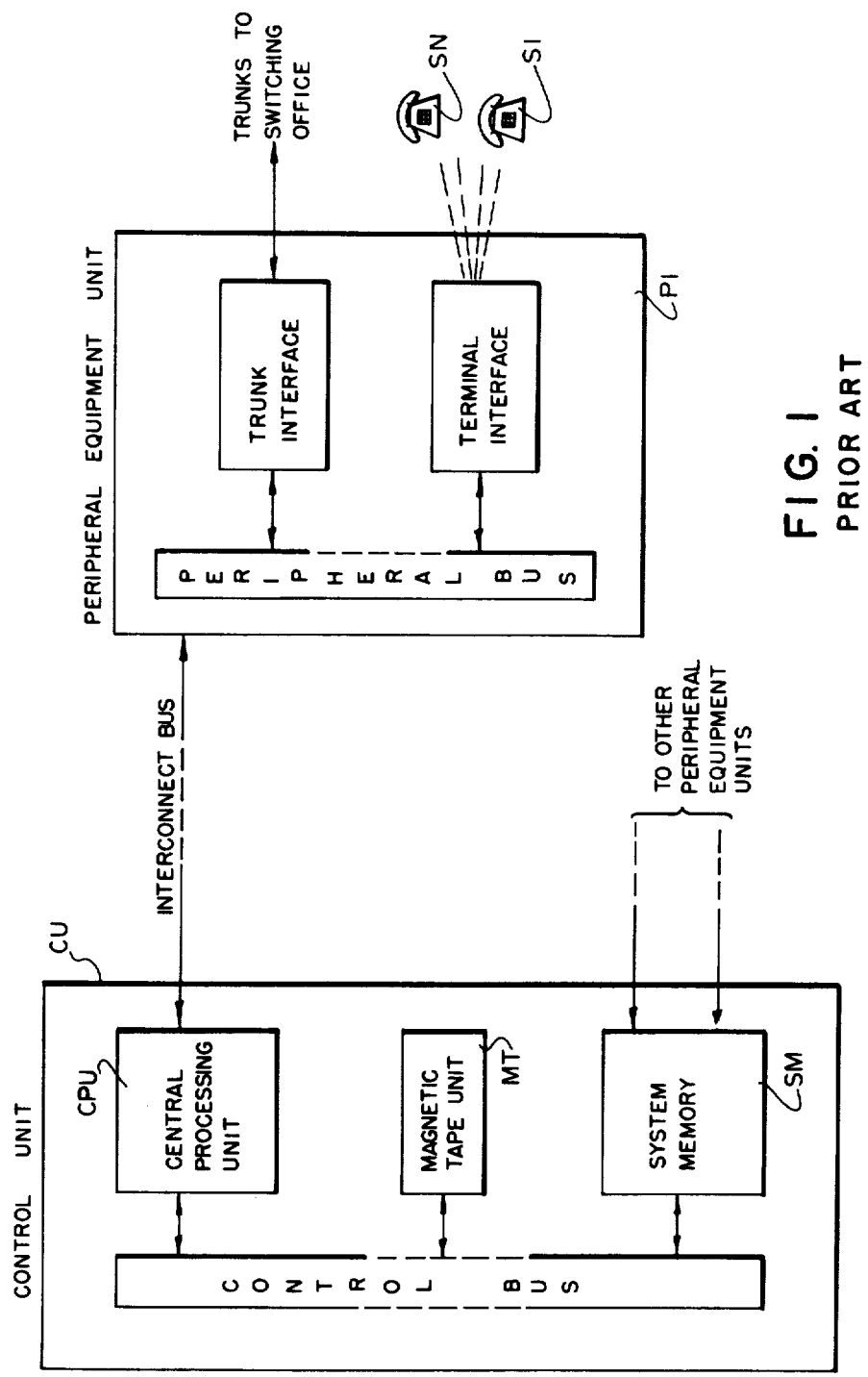
FIG. 1 is a block schematic of a multi-line, multi-station telephone exchange system capable of increased reliability according to the present invention.

The method of the present invention is utilized in a multi-line, multi-station telephone exchange system which performs internal switching functions as well as connects local station sets with an exchange office of the telephone network. The outline of a typical system is shown schematically in FIG. 1 of the drawings. It comprises a plurality of station sets Sl to Sn which are centrally connected to a peripheral equipment unit Pl. The unit Pl is in turn connected to a control unit CU which contains a central processing unit CPU that (among other tasks) controls access to a standby magnetic tape storage unit MT and a system memory SM. For clarity of description, FIG. 1 shows only essential elements of the system that are necessary for understanding the present invention.

Figure 2:
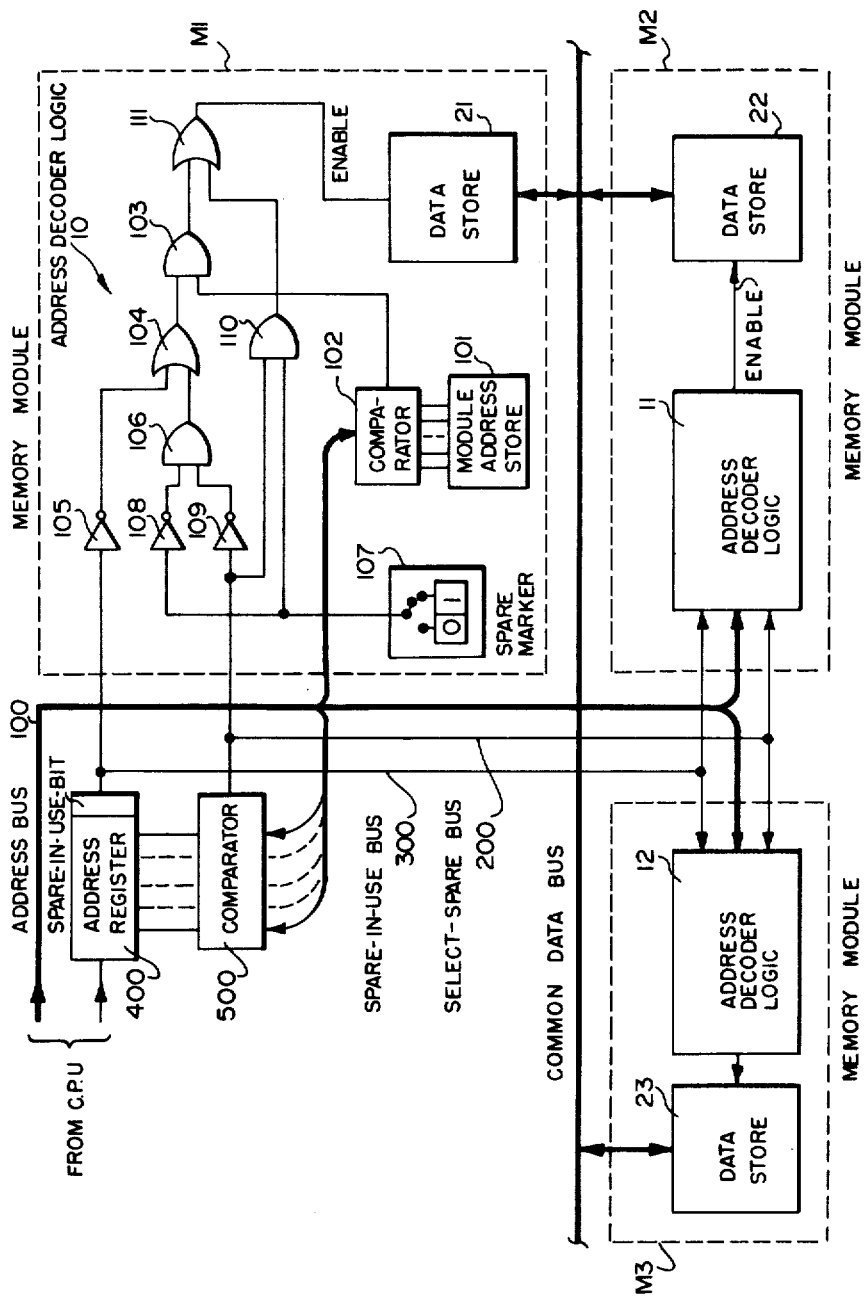
FIG. 2 is a block schematic of a circuit embodying the method of the present invention as utilized in the system of FIG. 1.

The sub-system of the control unit subject of the present invention is the system memory SM shown in FIG. 2 of the drawings in more detail. Again for reasons of clarity and ease of understanding, the system memory is shown with only three constituent memory modules M1, M2 and M3. Each memory module is callable via an address bus 100 by a unique individual address, the individual addresses being decoded in address decoder logic units 10, 11 and 12 which in turn enable the associated data store upon the occurrence of a match between the stored memory module address and the called address. The data from or into data stores 21, 22 and 23 is usually written and read from and on a common data bus. The address decoder logic unit 10 is shown in block schematic and comprises a module address store 101 supplying the module address to a comparator 102 which compares the same with the called address on address bus 100. The result of the comparison is fed to an AND-gate 103, which is also driven by an OR-gate 104. One input of the OR-gate 104 is driven from a spare-in-use bus 300 via an inverter 105. The other input of the OR-gate 104 is driven from an AND-gate 106, one input of which is driven from spare marker 107 via an inverter 108. The other input of the AND-gate 106 is driven from a select-spare bus 300 via an inverter 109. The spare marker 107 also drives an AND-gate 110, also driven by the select-spare bus 200. The output of the AND-gate 110 as well as that of the AND-gate 103 drives an OR-gate 111 which enables (and disables) the data store 21.

An address register 400 is controlled from the CPU of the system and is adapted to receive the address of a faulty memory module. One bit in the address register 400 is set to logical "1" when the register is being loaded with an address; it is termed spare-in-use bit and drives the spare-in-use bus 300. The contents of the address register 400 are input to a comparator 500 which continuously compares the address in the register 400 (if any) with the called address on the address bus 100. The result is output on the select-spare bus 200. The address bus 100, the spare-in-use bus 300 and the select-spare bus 200 all are inputs to each of the memory modules M1, M2 and M3.

Now the method of operation of the system will be described step by step. Assuming the memory module M1 is a low priority module and has been selected to be the substitute module, the first step is to set spare marker 107 to a logical "1", thus electronically designating that module as the substitute module. As long as no fault in any of the other memory modules M2 and M3 is detected, no address is stored in the address register 400 and the output of the comparator 500 connected to the select-spare bus 200 is low (at logical "0"). As a result, and unless enabled via its other input the output of the OR-gate 111 which enables the data store 21 remains low and, hence, the data stored 21 is inaccessible.

When a fault in one of the memory modules (say M3) is detected, the CPU enters the address of the memory module M3 into the address register 400 and simultaneously sets the spare-in-use but in that register to "1" (or high). Thus the spare-in-use bus 300 now is at a logical high.

The inverter 105 in the address decoder logic unit 10 inverts the logical high of the spare-in-use bus 300 to a logical low, and hence, the output of the OR-gate 104, unless otherwise driven by the AND-gate 106, remains at a logical low. The AND-gate 103 is thus disabled even when the comparator 102 indicates a match in addresses. The data store 21 could not, therefore, be enabled when the address of the memory module M1 is called. Memory module M1 (marked as substitute or spare module) has thus been inhibited from responding to its address.

In the present system, the (substitute) memory module M1 is loaded at this point with data identical to that in the faulty memory module M3. Such data is obtained from a standby magnetic tape unit MT in FIG. 1 containing the vital system data. Such operations are described in the above reference by Gschwind and are otherwise known in the art; pages 174–177, 274–279 and 310–311 are of particular pertinence in this regard. In addition, similar procedures of reading out data from a peripheral device (which the standby tape unit is) into a memory are mentioned in U.S. Pat. No. 3,771,143 to Taylor; for instance, beginning at line 54 in column 3 to line 11, column 4. The tape unit itself could not be used instead of the faulty memory module M3 because data retrieval from tape is usually slow. Of course, other means may be used in this process of loading the memory module M1 with the necessary data. For example, the present system being a telephone system, it could request that the data be transmitted over the telephone lines from a remote storage location.

As various memory module addresses appear on the address bus 100, the comparator 500 continuously compares them with the contents of the address register 400. When the address of the now faulty memory module M3 appears on the bus 100 the comparator indicates a match on the select-spare bus 200, thereby enabling the AND-gate 110 (the other input of which is at "1" through the setting of spare marker 107), which in turn enables the OR-gate 111 and hence the data store 21. The memory module M1, marked as a spare, is thus selected to respond instead of the faulty memory module M3.

What is claimed is

1. In a data processing system having a central processor and a plurality of memory modules, each having data initially stored therein, each callable by a unique address, and each having a comparator to cause access to the memory module upon occurrence of a match between an address called by the central processor and the unique address, a method for substituting a designated one of said plurality of memory modules for any other of said plurality should the latter become faulty while said system is in operation comprising the steps of:
   (a) retrieving from said central processor the unique address of said another memory module upon detection of a faulty in the latter and storing it into a register;
   (b) transmitting a permanent space-in-use signal to each of said memory modules;
   (c) transmitting a match signal to all memory modules upon occurrence of a match between a called memory module address and the address in said register; and
   (d) by means of logic circuits in each of said memory modules:
      (i) preventing access to said another memory module when called in the presence of a spare-in-use signal;
      (ii) preventing access to said designated memory module when called and the spare-in-use signal is present; and
      (iii) permitting access to said designated memory module only in the presence of both the spare-in-use signal and said match signal.

2. The data processing system of claim 1, performing supervision and control function within a multi-line multi-station telephone exchange system.

* * * * *